US009991089B2

(12) United States Patent
Mueller et al.

(10) Patent No.: US 9,991,089 B2
(45) Date of Patent: Jun. 5, 2018

(54) PARTICLE BEAM SYSTEM AND METHOD FOR OPERATING A PARTICLE OPTICAL UNIT

(71) Applicant: Carl Zeiss Microscopy GmbH, Jena (DE)

(72) Inventors: Ingo Mueller, Aalen (DE); Nicole Rauwolf, Deiningen (DE); Christof Riedesel, Essingen (DE); Thomas Kemen, Aalen (DE); Joerg Jacobi, Aalen (DE); Arne Thoma, Aalen (DE); Markus Doering, Heidelberg (DE); Dirk Zeidler, Oberkochen (DE); Juergen Kynast, Jena (DE); Gerd Benner, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days. days.

(21) Appl. No.: 15/788,338

(22) Filed: Oct. 19, 2017

(65) Prior Publication Data

US 2018/0040454 A1    Feb. 8, 2018

Related U.S. Application Data

(63) Continuation of application No. 14/730,505, filed on Jun. 4, 2015, now Pat. No. 9,799,485.

(30) Foreign Application Priority Data

Jun. 6, 2014    (DE) .................. 10 2014 008 383

(51) Int. Cl.
*H01J 37/21*    (2006.01)
*H01J 37/28*    (2006.01)
*H01J 37/10*    (2006.01)

(52) U.S. Cl.
CPC .............. *H01J 37/21* (2013.01); *H01J 37/10* (2013.01); *H01J 37/28* (2013.01);
(Continued)

(58) Field of Classification Search
CPC .......... H01J 37/10; H01J 37/14; H01J 37/141; H01J 37/1413; H01J 37/1416;
(Continued)

(56) References Cited

U.S. PATENT DOCUMENTS 9,536,702 B2    1/2017 Lang et al.
9,552,957 B2    1/2017 Zeidler et al.
(Continued)

FOREIGN PATENT DOCUMENTS

DE    10 2013 014 976    3/2015
DE    10 2013 016 113    3/2015
(Continued)

OTHER PUBLICATIONS

S.E. Kapl et al., „Characterization of CMOS programmable multi-beam blanking arrays as used for programmable multi-beam projection lithography and resistless nanopattering, Journal of Micromechanics and Microengineering, vol. 21, 2011, pp. 1-8.
(Continued)

*Primary Examiner* — David E Smith
(74) *Attorney, Agent, or Firm* — Fish & Richardson P.C.

(57) ABSTRACT

A method for operating a multi-beam particle optical unit comprises includes providing a first setting of effects of particle-optical components, wherein a particle-optical imaging is characterizable by at least two parameters. The method also includes determining a matrix A, and determining a matrix S. The method further includes defining values of parameters which characterize a desired imaging, and providing a second setting of the effects of the components
(Continued)

in such a way that the particle-optical imaging is characterizable by the parameters having the defined values.

24 Claims, 9 Drawing Sheets

(52) U.S. Cl.
CPC .................. *H01J 2237/0435* (2013.01); *H01J 2237/0492* (2013.01); *H01J 2237/28* (2013.01); *H01J 2237/31764* (2013.01); *H01J 2237/31774* (2013.01)

(58) Field of Classification Search
CPC .......... H01J 37/153; H01J 37/21; H01J 37/28; H01J 37/3171; H01J 2237/0435; H01J 2237/0492; H01J 2237/28; H01J 2237/31764; H01J 2237/31774
See application file for complete search history.

(56) References Cited

U.S. PATENT DOCUMENTS

| | | | |
|---|---|---|---|
| 9,799,485 | B2 | 10/2017 | Mueller et al. |
| 2004/0188636 | A1 | 9/2004 | Hosoda et al. |
| 2006/0289804 | A1 | 12/2006 | Knippelmeyer et al. |
| 2007/0228274 | A1 | 10/2007 | Elyasaf et al. |
| 2008/0210887 | A1 | 9/2008 | Buschbeck |
| 2009/0114818 | A1* | 5/2009 | Casares ................ H01J 37/045 250/307 |
| 2009/0159810 | A1 | 6/2009 | Knippelmeyer et al. |
| 2009/0256075 | A1 | 10/2009 | Kemen et al. |
| 2009/0261267 | A1 | 10/2009 | Wieland et al. |
| 2010/0065753 | A1* | 3/2010 | Enyama .............. H01J 37/1472 250/397 |
| 2010/0178602 | A1 | 7/2010 | Seto et al. |
| 2010/0320382 | A1* | 12/2010 | Almogy ................. H01J 37/05 250/307 |
| 2012/0104250 | A1 | 5/2012 | Bean et al. |
| 2012/0241606 | A1 | 9/2012 | Han |
| 2012/0273690 | A1 | 11/2012 | Wieland et al. |
| 2012/0305798 | A1 | 12/2012 | Zonnevylle et al. |
| 2013/0032729 | A1 | 2/2013 | Knippelmeyer |
| 2013/0187046 | A1 | 7/2013 | Zeidler et al. |
| 2014/0070099 | A1 | 3/2014 | Aliman et al. |
| 2014/0197322 | A1 | 7/2014 | Eder et al. |
| 2014/0224985 | A1 | 8/2014 | Rodgers et al. |
| 2015/0069235 | A1 | 3/2015 | Kemen et al. |
| 2015/0083911 | A1 | 3/2015 | Zeidler et al. |
| 2015/0090879 | A1 | 4/2015 | Zeidler et al. |
| 2015/0348738 | A1 | 12/2015 | Zeidler et al. |
| 2015/0348749 | A1 | 12/2015 | Lang et al. |
| 2015/0357157 | A1 | 12/2015 | Mueller et al. |
| 2017/0133194 | A1 | 5/2017 | Ziedler et al. |

FOREIGN PATENT DOCUMENTS

| | | |
|---|---|---|
| DE | 10 2014 008 083 A1 | 12/2015 |
| DE | 10 2014 008 105 A1 | 12/2015 |
| DE | 10 2014 008 383 A1 | 12/2015 |
| WO | WO 2005/024881 | 3/2005 |
| WO | WO 2007/028595 | 3/2007 |
| WO | WO 2007/028596 | 3/2007 |
| WO | WO 2007/060017 | 5/2007 |
| WO | WO 2008/101714 A2 | 8/2008 |
| WO | WO 2011/124352 A1 | 10/2011 |
| WO | WO 2012/041464 A1 | 4/2012 |
| WO | WO 2012/112894 A2 | 8/2012 |
| WO | WO 2012/151288 A1 | 11/2012 |
| WO | WO 2013/032949 A1 | 3/2013 |
| WO | WO 2015/043769 A1 | 4/2015 |

OTHER PUBLICATIONS

Zeiss, "Sigma Series: Your FE-SEM for Nanoscale Analytics", 2012, pp. 1-18 (http://www.optecgroup.com/upload/iblock/480/Sigma_FE_SEM.pdf).

German Office Action, with translation thereof, for corresponding DE Appl No. 10 2014 008 383.7, dated Mar. 17, 2015.

* cited by examiner

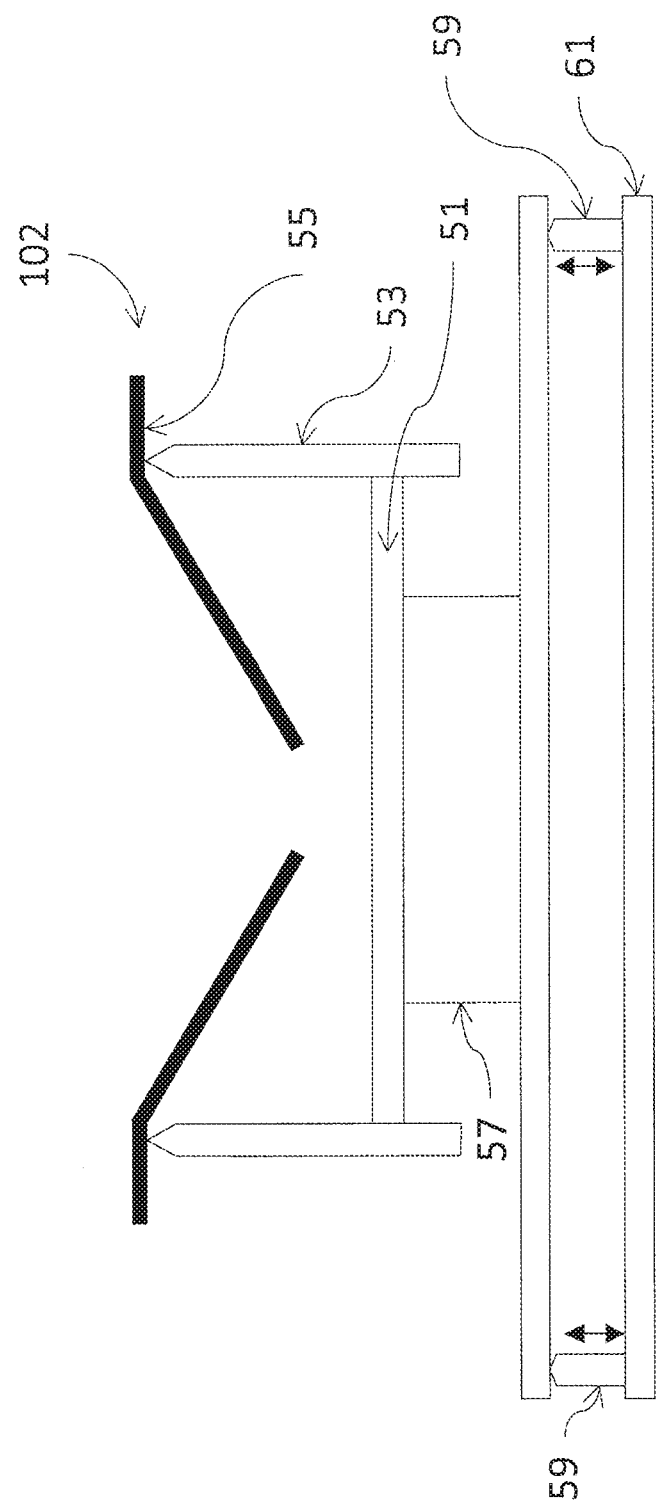

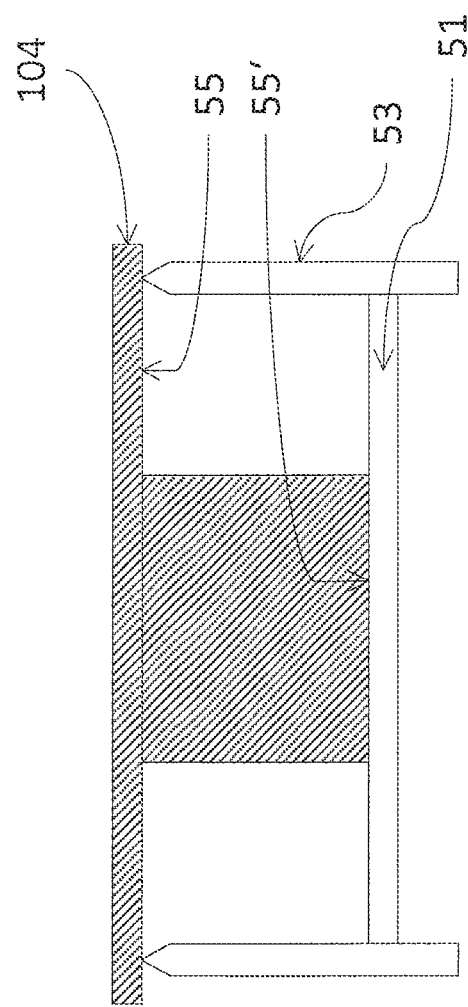

PARTICLE BEAM SYSTEM AND METHOD FOR OPERATING A PARTICLE OPTICAL UNIT

CROSS-REFERENCE TO RELATED APPLICATIONS

This application is a continuation of, and claims priority under 35 USC 120 to, U.S. application Ser. No. 14/730,505, filed Jun. 4, 2015, now U.S. Pat. No. 9,799,485 which claims benefit under 35 U.S.C. § 119 to German Application No. 10 2014 008 383.7, filed Jun. 6, 2014. The contents of both of these applications are hereby incorporated by reference in its entirety.

The invention relates to particle beam systems and methods for operating particle optical units.

Particle beam systems use particle optical units to influence beams of charged particles in a desired way, such that for example an optical imaging can be obtained with the beams of the charged particles. The charged particles can be electrons or ions, for example, and the particle beam systems can be used for example as microscopes or lithography apparatuses.

A particle optical unit usually has a plurality of particle-optical components, each of which has an effect on a particle beam passing through the respective particle-optical component. By way of example, the particle-optical component can be a particle-optical lens, which has a focusing effect on the particle beam, or the particle-optical component can be a beam deflector, which deflects the particle beam by an angle. For this purpose, the particle-optical components provide electric and/or magnetic fields which act on the charged particles of the particle beam, and values or strengths of these effects can be settable by the strengths of the electric and/or magnetic fields being changed, for example by changing electrical voltages which are applied to elements which provide electric fields, or changing electric currents which are fed to coils which generate magnetic fields.

In the case of a particle optical unit, the effects of each particle-optical component must be set such that the particle optical unit as a whole provides a desired effect, such as, for example, a particle-optical imaging of one plane into another plane. Correctly setting the effects of particle-optical components of a particle optical unit is often difficult in practice since a plurality of particle-optical components interact in a complicated way.

In the case of a particle optical unit which provides a particle-optical imaging, it may be desired to change the imaging scale of the imaging. This can be achieved by changing the focusing effect of one of the particle-optical lenses. However, this then usually also has the effect that the distance between the two planes which are imaged into one another changes, such that a defocusing also takes place besides the change in the imaging scale. In order to avoid this, the effects of other particle-optical components then also have to be changed. Besides the imaging scale and the distance between the planes imaged into one another, particularly in the case of particle beam systems in which extensive regions are imaged into one another particle-optically, the convergence of the beam path and the rotation are parameters which are to be set to desired values. Examples of particle beam systems in which extensive regions are imaged into one another particle-optically include electron microscopes and lithography apparatuses which operate with a multiplicity of parallel particle beams.

It is an object of the present invention to propose a method for operating a particle optical unit which facilitates a process of setting effects of particle-optical components in such a way that the particle optical unit overall has a desired effect. Furthermore, it is an object of the present invention to propose a particle beam system which uses a multiplicity of particle beams for generating an imaging in which the imaging scale, the convergence of the beam path and the rotation are settable as parameters of the imaging.

Embodiments of the invention provide a method for operating a particle optical unit having at least two, in particular three or four, particle-optical components through which at least one particle beam passes and the respective effect of which on the particle beam is settable. The method comprises providing a first setting of the effects of the particle-optical components in such a way that a first plane with particles of the particle beam is imaged particle-optically into a second plane, wherein the particle-optical imaging is characterizable by at least two, in particular three or four, parameters. The parameters can comprise for example an imaging scale, a rotation, a convergence of the beam path and a distance along the beam path between the first plane and the second plane. The imaging scale characterizes a ratio between the extent of an object to be imaged in the first plane and an extent of the image of the object in the second plane. The rotation characterizes the orientation of the image of the object to be imaged in the second plane about an optical axis of the particle optical unit since particle-optical components which provide their effect via, in particular, rotationally symmetrical magnetic fields lead to a change in the orientation. The convergence of the beam path characterizes the angle at which the principal rays of the particle beams which provide the optical effect impinge on the second plane. It is often desirable to provide a so-called telecentric imaging in which principal rays of the particle beams orthogonally pass through the first plane and the second plane independently of the lateral position in the plane. The distance between the first and second planes characterizes an operating distance at which an object is to be arranged relative to the particle optical unit in order that, for example, a surface of the object coincides with the second plane, such that the first plane is sharply imaged onto the surface of the object.

After the process of providing the first setting of the effects of the particle-optical components, the particle optical unit is thus set as an imaging particle optical unit. The method then furthermore comprises determining a linear or non-linear mathematical mapping which describes a relation between changes in the effects of the particle-optical components, for example on account of the change of currents through coils or voltages at electrodes, and changes in the parameters characterizing the particle-optical imaging, for example the imaging scale or convergence. In accordance with embodiments, such a relation in the linear case can be described by a matrix A, such that the following holds true:

$$\overrightarrow{\Delta p^1} = A \cdot \overrightarrow{\Delta w^1} \text{ with}$$

$$\overrightarrow{\Delta w^1} = \overrightarrow{w^1} - \overrightarrow{w} \text{ and}$$

$$\overrightarrow{\Delta p^1} = \overrightarrow{p^1} - \overrightarrow{p}$$

Wherein $\overrightarrow{w^1}$ is a vector having components $w_1^1$, $w_2^1$, ..., $w_n^1$ wherein n is the number of particle-optical components and each of the components $w_i^1$ represents a value of an effect of one of the particle-optical components in the case of the first setting; $\vec{w}$ is a vector having components $w_1, w_2, \ldots, w_n$, which represent the values of the effects of the particle-optical components in the case of a setting different from the first setting; $\vec{p^1}$ is a vector having components $p_1^1, p_2^1, \ldots, p_m^1$, wherein m is the number of parameters characterizing the particle-optical imaging and each of the components $p_i^1$ represents a value of one of the parameters in the case of the first setting; and $\vec{p}$ is a vector having components $p_1, p_2, \ldots, p_m$ which represent the values of the parameters in the case of the setting different from the first setting.

In accordance with embodiments, the matrix A can be determined by experiments. By way of example, proceeding from the first setting of the effects of the particle-optical components, individual effects can be varied and the resultant changes in the parameters characterizing the particle-optical imaging can be determined for example by measurement.

It is possible to carry out m×n measurements in order to determine the m×n entries of the matrix A: for each of the m parameters, the n particle-optical components are varied and the influence of each change of the components on the relevant parameter is determined in each case. This is carried out for all of the parameters. For each parameter this results in a number of equations that is equal to the number of particle-optical components. In this case, the changes of the particle-optical components have to be effected such that linearly independent systems of equations arise. From the equations for all of the parameters, all of the components of the matrix A arise in this way. Expressed mathematically, in each of the n measurements for each of the m row vectors $a_{i1}, a_{i2}, \ldots, a_{in}$ (i=1, \ldots, m) of the matrix A, a number of n equations arise which can be solved with respect to the elements of the row vector $a_{i1}, a_{i2}, \ldots, a_{in}$ (i=1, \ldots, m). That is to say that all of the matrix elements of the matrix A can be determined with m×n measurements. For the case where m is not equal to n, overdetermined or underdetermined systems of equations arise. However, this does not lead to any restrictions of the method in the next steps.

By way of example, in the simplest case, determining the matrix A can comprise generating the setting different from the first setting in such a way that only one of the components $\Delta w_1, \Delta w_2, \ldots, \Delta w_n$ of the vector $\overrightarrow{\Delta w^1}$ is different from zero, the particle-optical imaging that arises in the case of the setting of the particle-optical components that is different from the first setting is analyzed and the parameters characterizing the particle-optical imaging are determined. The system of equations for the corresponding row vector then reduces to a diagonal system.

In accordance with embodiments herein, determining the matrix A furthermore comprises repeating the process of generating the setting different from the first setting, wherein each time exactly one different one of the components $\Delta w_1, \Delta w_2, \ldots, \Delta w_n$ of the vector $\overrightarrow{\Delta w^1}$ is different from zero, but at the same time all other components of the vector $\overrightarrow{\Delta w^1}$ are zero. However, it is also possible for two or more components of the vector $\overrightarrow{\Delta w^1}$ to be different from zero. This last corresponds to the general case described above.

In accordance with further embodiments, determining the matrix A comprises numerically simulating the particle-optical imaging, such that the changes in the parameters characterizing the imaging which are brought about in the event of changes in the effects of the particle-optical components are determined on the basis of the numerical simulation.

The particle-optical components can comprise particle-optical lenses, the settable effect of which is a focusing effect, stigmators, the settable effect of which is an astigmatic effect, and other particle-optical components and also combinations thereof.

In accordance with embodiments, a particle beam system comprises a multi-beam source configured for generating a first field of a plurality of first particle beams; a first particle optical unit configured for directing the first particle beams onto an object; and a controller; wherein the first particle optical unit comprises at least two, in particular three or four, particle-optical lenses arranged in a beam path of the first particle optical unit; wherein the controller is configured for setting an effect of each of the particle-optical lenses of the first particle optical unit on the first particle beams in such a way that a first plane with particles of the first particle beams is imaged particle-optically onto a second plane and the second plane coincides with an object plane, such that the first particle beams impinge on the object at impingement locations which are situated in a second field.

The first particle optical unit used in the particle beam system firstly allows a setting in such a way that a distance between the first plane and the second plane is settable, such that if for example the first plane is positioned fixedly relative to the first particle optical unit and the object is arranged at a given distance from the first plane, the second plane can be set such that the latter is arranged at the object and coincides for example with the surface of the object. The first particle optical unit secondly allows further parameters, characterizing the particle-optical imaging, to be set to desired values. The parameters comprise in particular the imaging scale, the rotation and the convergence of the beam path, wherein these parameters are settable in particular independently of one another. This means that for example the imaging scale is changeable without the convergence of the beam path and the rotation being changed, or the rotation is changeable without the imaging scale and the convergence of the beam path being changed.

In accordance with embodiments, the multi-beam source is configured such that the generated beams pass through the first plane at locations which are arranged at a distance from one another and define the first field in the first plane. These locations can be positioned in the field in each case at identical distances from one another. Furthermore, the locations can form a rectangular lattice or a hexagonal lattice. In particular, the distances between the locations can be fixed, that is to say non-changeable. These locations in the first plane are imaged by the particle beams onto locations in the second plane or at the object at which the particle beams pass through the second plane or impinge on the object. In the second plane or on the object, these locations form the second field, which corresponds particle-optically to the first field, wherein the distances between the locations in the second field depend on the imaging scale of the particle-optical imaging. In accordance with embodiments, the controller is configured for changing the imaging scale and thus the distances between the impingement locations within the second field by changing the effects of the particle-optical lenses of the first particle optical unit.

The orientation of the second field in the second plane or on the object depends on the rotation of the particle-optical imaging. In accordance with embodiments, the controller is furthermore configured for changing the rotation and thus the orientation of the second field of impingement locations relative to the particle-optical lenses by changing the effects of the particle-optical lenses of the first particle optical unit.

The controller can furthermore be configured for changing the distances between the impingement locations within the second field by changing the effects of the particle-optical lenses of the first particle optical unit without changing the orientation of the second field of impingement locations relative to the particle-optical lenses in the process.

The controller can likewise be configured for changing the orientation of the second field of impingement locations relative to the particle-optical lenses by changing the effects of the particle-optical lenses of the first particle optical unit without changing the distances between the impingement locations within the second field in the process.

In accordance with embodiments, the particle beam system furthermore comprises a detector having a plurality of detection regions arranged in a third field; a second particle optical unit configured for directing second particle beams emerging from the impingement locations in the second field of impingement locations at the object onto the third field of detection regions; wherein the second particle optical unit has at least two, in particular three or four, particle-optical lenses arranged in a beam path of the second particle optical unit between a third plane and a fourth plane. The controller is configured for setting an effect of each of the particle-optical lenses of the second particle optical unit on the second particle beams in such a way that the third plane is imaged into the fourth plane. In this case, the third plane can coincide with the surface of the object and the field of detection regions can be arranged in the fourth plane, such that each of the second particle beams impinges on at least one of the detection regions arranged in the third field and mutually different second particle beams impinge on mutually different detection regions.

This particle beam system can be operated as a particle beam microscope which simultaneously performs measurements of the properties of the object at a plurality of locations at the object.

The second particle optical unit is configured in such a way that, firstly, the third plane coincides with the second plane of the first particle optical unit or the surface of the object and the third plane is imaged via the second particle beams proceeding from the third plane into the fourth plane, in which the third field of detection regions is arranged. Secondly, the second particle optical unit can be configured for setting further parameters of the imaging, such as, for example, the imaging scale, the rotation and the convergence of the beam path. On account of the settability of the imaging scale, it is thus possible, with given distances between the detection regions and changeable distances between the impingement locations of the first particle beams in the second plane, to image the individual impingement locations onto corresponding detection regions via the second particle beams.

It is possible that not all of the parameters are relevant to a specific operating mode of the multi-beam particle system. It is possible, for example, that the convergence of the beam path in the second particle optical unit is of less relevance than the rotation or the imaging scale. Fewer particle-optical components may then suffice in order to set the desired remaining parameters. If, for example, the position of a diffraction plane is intended to remain virtually constant, a fixed excitation can be preselected and determined for specific lenses which have a highly determining influence on the position of the diffraction plane.

In accordance with embodiments, the controller is furthermore configured for compensating for changes in the distances between the impingement locations within the second field by changing the effects of the particle-optical lenses of the second particle optical unit, such that, in the event of changes in the distances between the impingement locations within the second field, each of the second particle beams impinges on the at least one of the detection regions arranged in the third field and mutually different second particle beams impinge on mutually different detection regions.

In accordance with exemplary embodiments herein, the controller is furthermore configured for compensating for changes in the orientation of the second field of impingement locations relative to the particle-optical lenses of the second particle optical unit by changing the effects of the particle-optical lenses of the second particle optical unit, such that, in the event of changes in the orientation of the second field of impingement locations, each of the second particle beams impinges on the at least one of the detection regions arranged in the third field and mutually different second particle beams impinge on mutually different detection regions.

The first and second particle optical units can be embodied as separate particle optical units which have no particle-optical lenses in common. However, it is also possible for at least one particle-optical lens of the at least two, in particular three or four, particle-optical lenses of the first particle optical unit to be at least one of the at least two, in particular three or four, particle-optical lenses of the second particle optical unit, such that the first and the second particle optical units have one or a plurality of common lenses. The at least one common lens can be for example an objective lens of a particle-optical microscope. In accordance with embodiments herein, the particle beam system comprises a particle-optical switch arranged in the beam paths of the first and second particle optical units.

Embodiments of the invention are explained in greater detail below with reference to figures, in which FIG. 1 shows a conventional particle beam system;

FIGS. 14a, 14b and 14c show cross sections through an objective lens, a measuring system and a calibration object for elucidating an adjustment technique.

Figure 1:
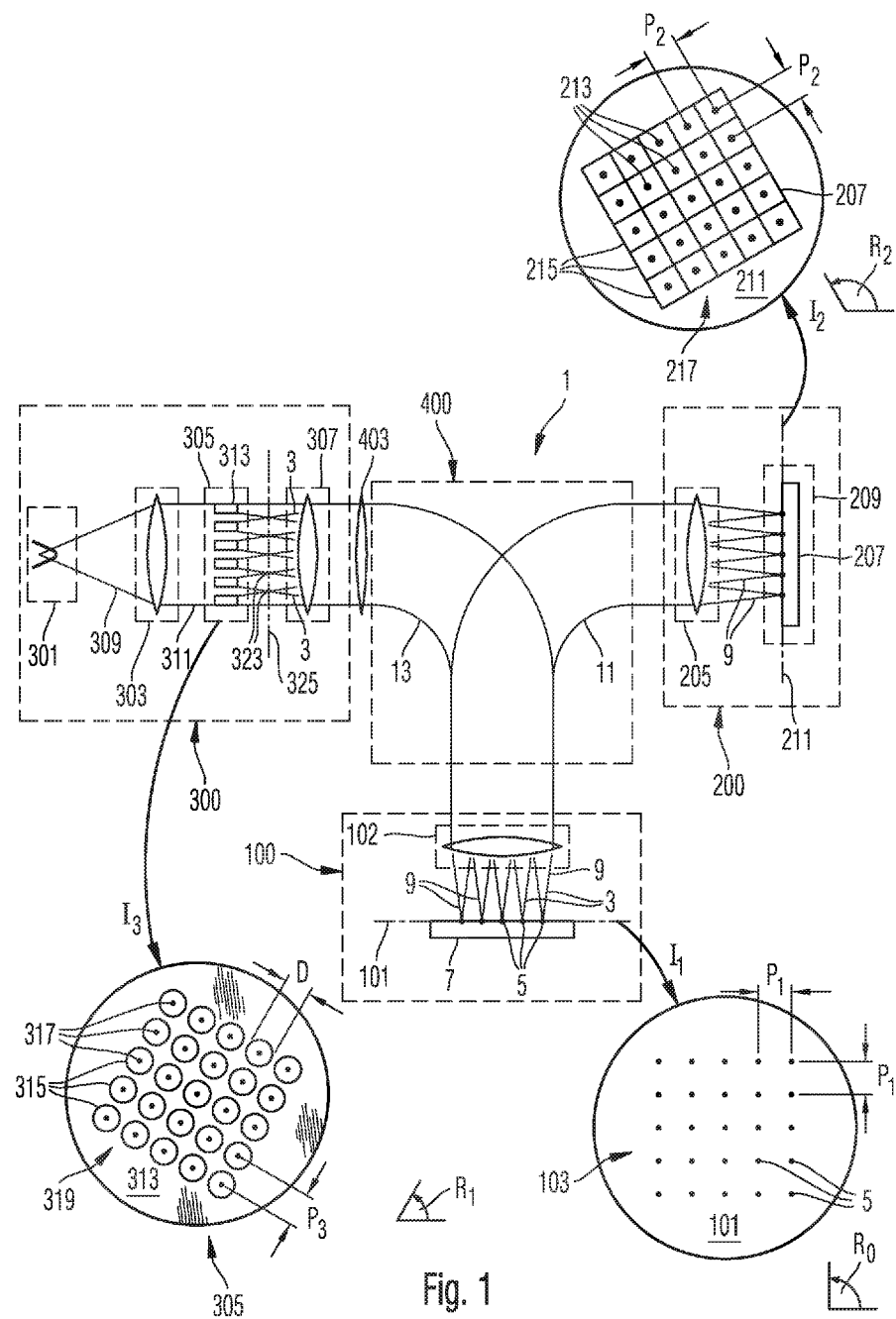

FIG. 1 is a schematic illustration of a multi-beam inspection system which uses a plurality of particle beams. The inspection system generates a plurality of particle beams which impinge on an object to be examined in order to generate there electrons which proceed from the object and are subsequently detected. The inspection system 1 is of the scanning electron microscope (SEM) type which uses a plurality of primary electron beams 3 which impinge at locations 5 on a surface of the object 7 and generate a plurality of electron beam spots there. The object 7 to be examined can be of an arbitrary type and comprise for example a semiconductor wafer, a biological sample and an arrangement of miniaturized elements or the like. The surface of the object 7 is arranged in an object plane 101 of an objective lens 102 of an objective lens system 100.

The enlarged excerpt I1 in FIG. 1 shows a plan view of the object plane 101 with a regular rectangular field 103 of impingement locations 5 which are formed in the plane 101. In FIG. 1, the number of impingement locations is 25, which are arranged as a 5×5 field 103. The number 25 of impingement locations is a small number chosen for reasons of simplified illustration. In practice, the number of beams or impingement locations can be chosen to be significantly greater, such as, for example, 20×30, 100×100 and the like.

In the embodiment illustrated, the field 103 of impingement locations 5 is a substantially regular rectangular field with a constant distance p1 between adjacent impingement locations. Exemplary values of the distance p1 are 1 μm, 10 μm or 40 μm. However, it is also possible for the field 103 to have other symmetries, such as, for example, a hexagonal symmetry.

A diameter of the beam spots shaped in the object plane 101 can be small. Exemplary values of this diameter are 1 nm, 5 nm, 100 nm and 200 nm. Focusing of the particle beams 3 for shaping the beam spots 5 is carried out by the objective lens system 100.

The particles impinging on the object generate electrons which emanate from the surface of the object 7. The electrons emanating from the surface of the object 7 are shaped by the objective lens 102 to form electron beams 9. The inspection system 1 provides an electron beam path 11 in order to feed the multiplicity of electron beams 9 to a detection system 200. The detection system 200 comprises an electron optical unit with a projection lens system 205 in order to direct the electron beams 9 onto an electron multi-detector 209.

The excerpt I$_2$ in FIG. 1 shows a plan view of a plane 211 in which individual detection regions are arranged, on which the electron beams 9 impinge at locations 213. The impingement locations 213 form a second field 217 with a regular distance p2 between the impingement locations. Exemplary values of the distance p2 are 10 μm, 100 μm and 200 μm.

The primary electron beams 3 are generated in a beam generating device 300 comprising at least one electron source 301, at least one collimation lens 303, a multi-aperture arrangement 305 and a field lens system 307. The electron source 301 generates a diverging electron beam 309, which is collimated by the collimation lens 303 in order to shape a beam 311 which illuminates the multi-aperture arrangement 305.

The excerpt I3 in FIG. 1 shows a plan view of the multi-aperture arrangement 305. The multi-aperture arrangement 305 comprises a multi-aperture plate 313 having a plurality of openings or apertures 315 formed therein. Midpoints 317 of the openings 315 are arranged in a field 319 corresponding to the field 103 formed by the beam spots 5 in the object plane 101. A distance p3 between the midpoints 317 of the apertures 315 can have exemplary values of 5 μm, 100 μm and 200 μm. The diameters D of the apertures 315 are smaller than the distance p3 between the midpoints of the apertures. Exemplary values of the diameters D are 0.2×p3, 0.4×p3 and 0.8×p3.

Electrons of the illuminating beam 311 pass through the apertures 315 and form electron beams 3. Electrons of the illuminating beam 311 which are incident on the plate 313 are trapped by the latter and do not contribute to forming the electron beams 3.

The multi-aperture arrangement 305 focuses the electron beams 3 in such a way that beam foci 323 are formed in a plane 325. A diameter of the foci 323 can be 10 nm, 100 nm and 1 μm, for example.

The field lens system 307 and the objective lens 102 provide a first imaging particle optical unit for imaging the plane 325 in which the foci are formed onto the object plane 101, such that a field 103 of impingement locations 5 or beam spots is formed there on the surface of the object 7.

The objective lens 102 and the projection lens system 205 provide a second imaging particle optical unit for imaging the object plane 101 onto the detection plane 211. The objective lens 102 is thus a lens which is both part of the first and part of the second particle optical unit, while the field lens system 307 belongs only to the first particle optical unit and the projection lens system 205 belongs only to the second particle optical unit.

A beam switch 400 is provided in the beam path of the first particle optical unit between the multi-aperture arrangement 305 and the objective lens system 100. The beam switch 400 is also part of the second particle optical unit in the beam path between the objective lens system 100 and the detection system 200.

The beam switch 400 constitutes a non-rotationally symmetrical electron-optical imaging system. For the imaging performance of this particle optical unit 400 in the primary beam path 13 it is important that the particles in the primary beam path pass through the particle optical unit at the correct angle of incidence and at the correct location of incidence. Correct in this sense means that the deviations of the angle of incidence and of the location of incidence deviate to a sufficiently small extent from the values used in numerical simulations. However, the beam switch 400, on account of its non-rotationally symmetrical construction, does not provide a direct criterion for determining the location of incidence and angle of incidence. A direct possibility for determining these so-called incidence conditions is, for example, to introduce apertures into the beam path upstream of the beam switch, which apertures are adjustable very accurately with respect to the sector fields of the beam switch. Since the apertures should not be fixedly installed upstream of the beam switch on account of the extensive image field, but rather should be extendable and retractable via a mechanical diaphragm drive, the use of apertures is not always possible for space reasons. In this case, it can be advantageous to insert an adjustment lens 403 (see FIG. 1) between the beam generating device 300 and the beam switch 400. The adjustment lens 403 consists at least of a coil and optionally a lens yoke, both of which can be matched mechanically very accurately to the beam switch 400. That is to say that the positional tolerances of the coil with respect to the beam switch 400 can be very small. The exact mechanical position of the adjustment lens 403 with respect to the beam switch 400 can be determined for example via electron-optical simulations. The coil of the adjustment lens is switched off during normal operation of the particle-optical system. In adjustment operation, the beam path downstream of the beam generating device 300 can be set via deflectors (not shown) such that the primary beam bundle 13 does not drift in the event of a change in the excitation of the adjustment lens 403 and/or in the event of reversal of the polarity of the adjustment lens 403. In this case, it is ensured that the primary beam bundle impinges on the centre of the adjustment lens 403 and runs parallel to the optical axis of the adjustment lens. On account of the matching of the adjustment lens 403 with respect to the beam switch, it is thereby ensured that the location of incidence and the angle of incidence in the beam switch are sufficiently accurately within the tolerance range (error budget) of the values resulting from the simulation.

Further information concerning such multi-beam inspection systems and components used therein, such as, for instance, particle sources, multi-aperture plates and lenses, can be obtained from the international patent applications WO 2005/024881, WO 2007/028595, WO 2007/028596 and WO 2007/060017, and the German patent applications having the application numbers DE 10 2013 016 113.4 and DE 10 2013 014 976.2, the disclosure of which in the full scope thereof is incorporated by reference in the present application.

The first particle optical unit provides a particle-optical imaging of the first plane 325 into the second plane 101. One parameter for characterizing the particle-optical imaging is the distance between the first plane 325 and the second plane 101 along the beam axis. This distance is changeable, for example by the effect of the field lens system 307 or the effect of the lens 102 being changed. A further parameter for characterizing the particle-optical imaging is the rotation which arises by virtue of the effect of the lenses 307 and 102 being generated by magnetic fields. The latter lead to a rotation, such that the individual particle beams do not move rectilinearly but rather along a helical path along the beam path.

FIG. 1 shows a desired orientation for example of the field 103 of the impingement locations in such a way that the latter are arranged along horizontal and vertical lines in FIG. 1. A value of this orientation is designated by the angle R0 in FIG. 1. On account of the rotation of the particle-optical imaging provided by the first particle optical unit, the field of the particle beams must have an orientation in such a way that the particle beams, after passing through the first particle optical unit, impinge on the plane 101 as a field with the orientation R0. The requisite orientation of the field 319 of the generated particle beams is represented by the angle R1 in FIG. 1.

The second particle optical unit also provides a particle-optical imaging which can have the distance between the planes 101 and 211 as a characterizing parameter. Furthermore, the rotation is also a parameter for characterizing the second particle optical unit. The field 103 of second particle beams which proceeds from the plane 101 with the orientation R0, after passing through the second particle optical unit, impinges on the plane 211 with an orientation, which is designated by the angle R2 in FIG. 1.

In the schematic illustration in FIG. 1, principal rays of the individual particle beams 3, 9 pass through the planes 325, 101 and 211 orthogonally in each case. Such a beam path is designated as a telecentric beam path and is advantageous in practice since, for example, changes in the distance between the object 7 and the objective lens 102 indeed lead to an enlargement of the beam spots on the object, but not to a change in the distance p1 between the beam spots. However, it is possible that, in the case of changed settings of the effects of the particle-optical lenses of the first and/or second particle optical unit, the convergence of the beam path changes, that is to say that, for example, principal rays of the particle beams 3 which run at a distance from an optical axis of the objective lens 102 no longer impinge on the plane 101 orthogonally.

Figure 2A:
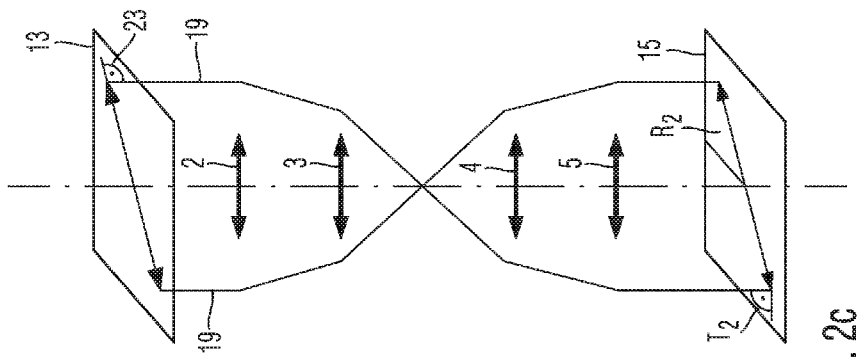
FIGS. 2a, 2b and 2c show schematic illustrations of imagings in one embodiment of a particle beam system according to the invention.

FIG. 2a is a schematic illustration of a particle optical unit 1 comprising four particle-optical lenses 2, 3, 4 and 5 arranged along an optical axis 7 of the particle optical unit 1. The lenses 2, 3, 4, 5 are embodied as magnetic lenses whose coils that generate the magnetic field of the lens are supplied with an excitation current by a controller 9, wherein the excitation current is settable for each of the lenses, as is indicated schematically in FIG. 2a by arrows 9 representing the settable excitation. The distances between the lenses 2, 3, 4, 5 along the optical axis 7 are usually fixed by virtue of the design of the lenses, that is to say are not changeable during operation. However, the optical properties of the particle optical unit can be changed by the controller 9 by changing the effects of the lenses on a particle beam by virtue of the controller 9 supplying the individual lenses with settable excitation currents.

The particle optical unit 1 images a first plane 13 particle-optically into a second plane 15, which are arranged at a distance from one another along the optical axis 7. In the schematic illustration in FIG. 2a, this imaging is represented by an arrow 17 arranged in the first plane 13 and by two field rays 19 of principal rays of particle beams which image the arrow 17 into an arrow 21 arranged in the second plane 15.

This imaging can be characterized by four parameters: the first parameter is the distance between the first plane 13 and the second plane 15 along the optical axis 7. The second parameter is the imaging scale of the imaging, which results from the ratio of the lengths of the arrows 21 and 17. The third parameter is the rotation resulting from the orientation of the arrow 21 about the optical axis 7 for a given orientation of the arrow 17 about the optical axis 7. In FIG. 2a, the orientation of the arrow 17 is represented as an angle R and the orientation of the arrow 21 is represented as an angle R1. The fourth parameter is the convergence of the beam path, which results from an angle at which the field rays 19 pass through the planes 13 and 15 at a given distance from the optical axis 7. In FIG. 2a, these are a right angle 23 at the plane 13 and a right angle T1 at the plane 15, such that the imaging is telecentric.

It shall now be assumed that the particle-optical imaging elucidated by the particle optical unit 1 with reference to FIG. 2a is intended to be changed, specifically in such a way that the imaging scale is increased. For this purpose, the controller has to modify the setting of the effects of the lenses 2, 3, 4, 5 in accordance with FIG. 2a.

Figure 2B:
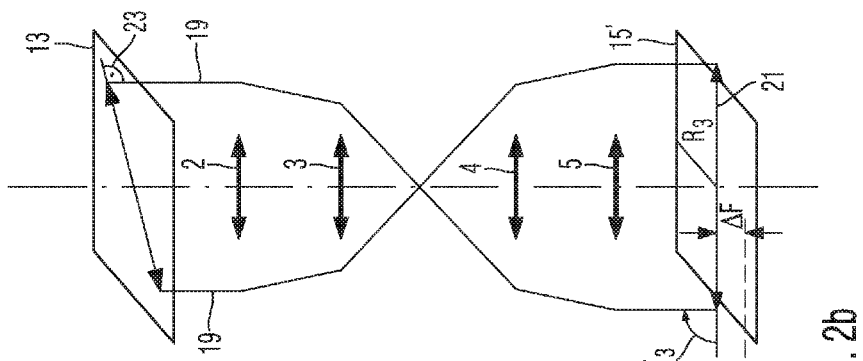

FIG. 2b shows a setting of the effects of the lenses 2, 3, 4 and 5 that is different from the setting in accordance with FIG. 2a, wherein the settings of the effects of the lenses 2, 4 and 5 are identical to the settings in the setting in accordance with FIG. 2a, and only the setting of the lens 3 is different from the setting in accordance with FIG. 2a. This firstly leads to an increase in the value of the imaging scale, which is evident in FIG. 2b from the greater length of the arrow 21 in comparison with FIG. 2a. However, this also has the effect that the first plane 13 is imaged into a second plane 15', which is at a distance from the first plane 13 which is smaller than the corresponding distance in the case of the setting in accordance with FIG. 2a by a value ΔF. Furthermore, the arrow 21 is arranged in the plane 15' with an orientation R3 that is different from the orientation R1 in FIG. 2a. The rotation of the imaging has thus changed by ΔR=R3−R1.

Furthermore, the field rays 19 in FIG. 2b impinge on the plane 15' at an angle T3, such that the telecentricity or the convergence of the beam path has likewise changed by comparison with the setting in accordance with FIG. 2a, wherein the value of the change in the convergence of the beam path can be described by ΔT=T3−T1.

This shows that the change in the effect of only one particle-optical component in a particle optical unit leads to changes in four parameters that characterize the particle-optical imaging provided by the particle optical unit.

In practice, however, it is desired to change settings of a particle optical unit such that, as a result of the change of the setting, only one parameter characterizing the particle-optical imaging changes, and the other parameters remain unchanged. For this purpose, it is necessary to change the settings of the effects of a plurality of particle-optical components jointly. However, it is difficult to determine the requisite changes in the values of the effects of the individual particle-optical components in order to achieve this aim. In practice, this is often conventionally carried out iteratively.

Figure 3:
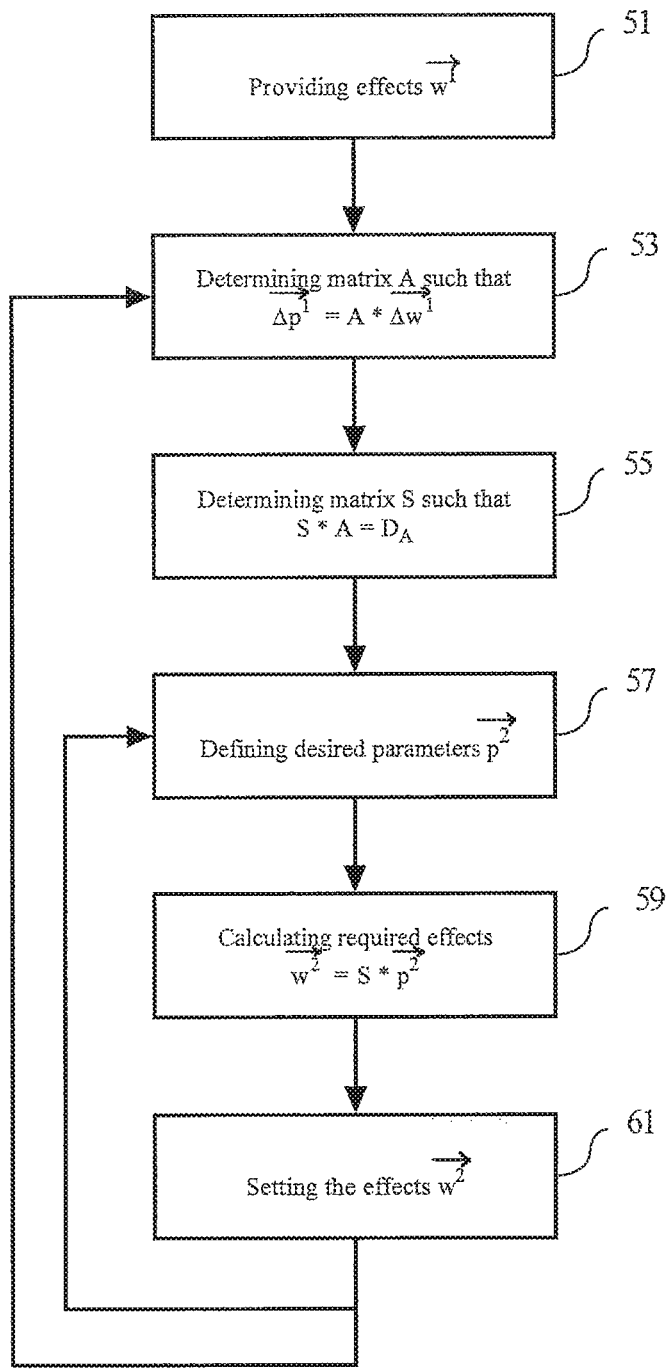
FIG. 3 shows a flowchart for elucidating one embodiment of a method for operating a particle optical unit.

One example of a method for setting the effects of particle-optical components of a particle optical unit in such a way that parameters characterizing the imaging have desired values is described below with reference to FIG. 3. In this case, the starting point for the method is that, in a step 51, a first setting of the effects of the particle-optical components is provided in such a way that a first plane is imaged into a second plane. The values of the effects of the individual particle-optical components in the first setting are represented by a vector $\vec{w^1}$. The values of the parameters characterizing the imaging can be represented by a vector $\vec{p^1}$.

It shall now be desired to modify the first setting of the effects of the particle-optical components such that, in a second setting, the parameters characterizing the imaging have desired values represented by a corresponding vector $\vec{p^2}$. The task then consists in finding those of the values of the effects $\vec{w^2}$ which are necessary for this second setting.

For this purpose, in a step 53, a matrix A is determined in such a way that the following holds true:

$$\vec{\Delta p^1} = A \cdot \vec{\Delta w^1} \text{ with}$$

$$\vec{\Delta w^1} = \vec{w^1} - \vec{w} \text{ and}$$

$$\vec{\Delta p^1} = \vec{p^1} - \vec{p}$$

Herein, $\vec{\Delta w^1}$ is a vector representing the change in the values of the effects of the optical components by comparison with the setting $\vec{w^1}$ in step 51, and $\vec{\Delta p^1}$ is a vector indicating the change in the values of the parameters which arise when the values of the effects are changed by $\vec{\Delta w^1}$.

The matrix A can be determined for example by numerical simulation or experimentally at the particle optical unit itself by a procedure in which changed settings are brought about by varying the values of the effects of the individual particle-optical components and the resulting changes in the parameters for characterizing the particle-optical imagings that arise are determined by measurement, for example.

It is possible to carry out m×n measurements in order to determine the m×n entries of the matrix A: for each of the m parameters, the n particle-optical components are varied and the influence of each change of the components on the relevant parameter is determined in each case. This is carried out for all of the parameters. For each parameter this results in a number of equations that is identical to the number of particle-optical components.

An example is explained below in which the parameters characterizing the imaging are the convergence, the rotation and the imaging scale, such that the number m=3. Δtele, Δrot and Δmag subsequently represent changes in these parameters. In this example, the imaging is provided by four lenses, such that the number of particle-optical components is n=4. The effects of the lenses are generated by electric currents I.

The equation $\vec{\Delta p^1} = A \cdot \vec{\Delta w^1}$ can be written for a variation of the currents $\Delta I_i$ as $$\begin{pmatrix} \Delta tele \\ \Delta rot \\ \Delta mag \end{pmatrix} = \begin{pmatrix} a_{11} & a_{12} & a_{13} & a_{14} \\ a_{21} & a_{22} & a_{23} & a_{24} \\ a_{31} & a_{32} & a_{33} & a_{34} \end{pmatrix} \cdot \begin{pmatrix} \Delta I_1 \\ \Delta I_2 \\ \Delta I_3 \\ \Delta I_4 \end{pmatrix},$$

wherein the resulting changes in the parameters Δtele, Δrot and Δmag are measured in three measurements. The elements $a_{ij}$ of the matrix are initially unknown. A total of n=4 different variations of the currents $\Delta I_i$ are set and the three changes of the parameters Δtele, Δrot and Δmag are measured in each of the four settings, such that a total of 12 measurements are carried out.

The values $a_{11}, \ldots, a_{14}$ can then be determined by setting for the changes of the first parameter Δtele $$\begin{pmatrix} \Delta tele^I \\ \Delta tele^{II} \\ \Delta tele^{III} \\ \Delta tele^{IV} \end{pmatrix} = \begin{pmatrix} \Delta I_1^I & \Delta I_2^I & \Delta I_3^I & \Delta I_4^I \\ \Delta I_1^{II} & \Delta I_2^{II} & \Delta I_3^{II} & \Delta I_4^{II} \\ \Delta I_1^{III} & \Delta I_2^{III} & \Delta I_3^{III} & \Delta I_4^{III} \\ \Delta I_1^{IV} & \Delta I_2^{IV} & \Delta I_3^{IV} & \Delta I_4^{IV} \end{pmatrix} \cdot \begin{pmatrix} a_{11} \\ a_{12} \\ a_{13} \\ a_{14} \end{pmatrix}$$

wherein the upper Roman indices denote the number of the variation of the currents. This equation can be solved with respect to $a_{11}, \ldots, a_{14}$. The elements of the first row of the matrix A are obtained as a result. A corresponding procedure is then adopted for Δrot and Δmag in order to calculate the elements for the second and third rows of the matrix A, such that all of the elements of the matrix A are then calculated. For this purpose, it is helpful if the variations of the currents are chosen such that in the above equation the row vectors having the elements $\Delta I_i^j$, are linearly independent. This method can analogously be applied to other particle-optical components, such as to stigmators, for example. In this case, complex numbers are advantageously used for representing the parameters $\vec{p}$, the matrix A and the effects $\vec{w}$.

After the matrix A has been determined in step 53, in a step 55 a matrix S is determined in such a way that the following holds true:

$$S \cdot A = D_A,$$

wherein $D_A$ is a diagonal matrix or a matrix which is almost diagonal. A matrix is almost diagonal if the non-diagonal elements are significantly smaller than the diagonal elements. Such matrices can arise in particular if the matrix S is calculated numerically and the matrix A is ill-conditioned. In this case, it is possible, in particular, to determine the matrix S such that $$S = A^{-1}$$

holds true, that is to say that the matrix S is calculated by inversion of the matrix A. The matrix $D_A$ is then the unit matrix or almost the unit matrix, that is to say that the diagonal elements of the matrix $D_A$ differ only slightly from 1, and the non-diagonal elements differ only slightly from 0.

Afterwards, the values of the parameters characterizing the desired imaging are defined in a step 57. These values can be represented as a vector $\vec{p^2}$. Afterwards, in a step 59, the changes in the effects $\vec{\Delta w^2}$ that are necessary for obtaining the desired values $\vec{p^2}$ relative to the setting from step 51 are determined in accordance with $$\vec{\Delta w^2} = S \cdot \vec{\Delta p^2} \text{ with}$$

$$\vec{\Delta w^2} = \vec{w^2} - \vec{w^1} \text{ and}$$

$$\vec{\Delta p^2} = \vec{p^2} - \vec{p^1}$$

The effects $\vec{w^2}$ required for the second setting thus arise as a result of the equation $\vec{w^2} = \vec{w^1} + \vec{\Delta w^2}$. These values of the effects are set in a step 61, whereupon the particle optical unit can be operated with the desired imaging.

Furthermore, it is possible subsequently to perform further, different setting of the effects of the particle-optical components. For this purpose, the method can jump to step 57, in which new desired values of the parameters are determined, and the setting of the new effects can be performed in step 59, wherein the diagonal matrix $D_A$ previously determined in step 55 is used for the calculation. This is readily possible in particular if the magnitude of the vector $\vec{\Delta w^2}$ is small and small changes in the effects of the particle-optical components are thus necessary in comparison with the setting provided in step 51. In the case of larger required changes in the effects it may be advisable to jump to the processing in step 53 after step 61, in order to calculate a new matrix A for the setting effected in step 61, the new matrix subsequently being inverted and used for calculating new settings of the effects in steps 59 and 61.

Figure 2C:
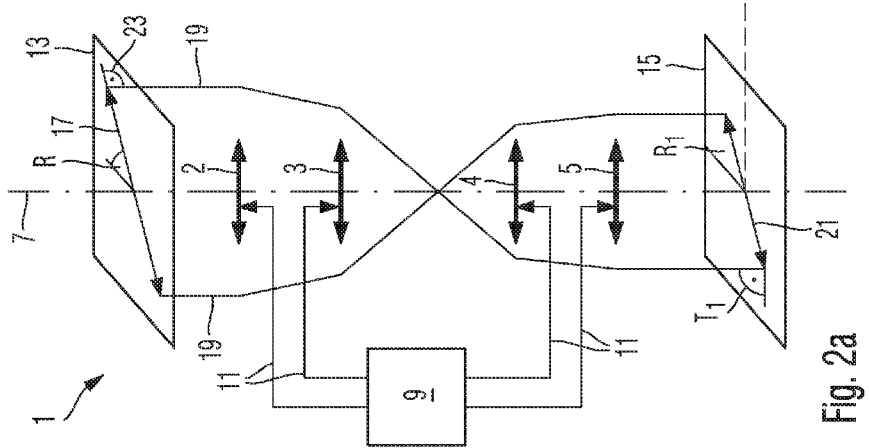

The method explained above makes it possible to modify the setting of the effects of the lenses 2, 3, 4, 5 in accordance with FIG. 2a such that only the imaging scale of the imaging is increased, the distance between the first and second planes remains the same ($\Delta F=0$), the rotation remains the same ($\Delta R=R2-R1=0$) and the convergence of the beam path remains the same ($\Delta T=T2-T1-0$). Such a setting of the effects of the particle-optical components, that is to say of the lenses 2, 3, 4, 5, is illustrated in FIG. 2c.

The method for setting a particle optical unit was explained above with reference to FIGS. 2a, 2b and 2c and on the basis of a particle optical unit which images a first plane into a second plane with four lenses, wherein the four lenses are arranged between these two planes. However, the method is not restricted thereto. More or fewer lenses can be used for providing the imaging. A virtual imaging can be realized, such that not all of the lenses that provide the imaging need be arranged between the two planes and one or a plurality of lenses can be arranged in the beam path upstream of the first plane or downstream of the second plane. Furthermore, the imaging can image the first plane into one or a plurality of intermediate image planes, which are then subsequently imaged into the second plane. Furthermore, it is not necessary to form exactly one cross-over between the first and second planes. Rather, it is also possible to form a plurality of cross-overs or no cross-over at all.

It is desirable that the electron microscopy system explained with reference to FIG. 1 can be operated such that the distance $p_1$ between mutually adjacent impingement locations of the particle beams 3 on the object is settable and the orientation R0 of the field of impingement locations is likewise settable. For this purpose, it is necessary that the first and second particle optical units are in each case configured for setting the imaging scale and the rotation independently of one another, specifically preferably in such a way that the convergence of the beam path does not change. This can be achieved by the first and second particle optical units being embodied in the manner as explained above with reference to FIG. 2a and FIG. 3. This means that four or more lenses are arranged in each of the two particle optical units shown schematically in FIG. 1, which lenses can be controlled by a controller in accordance with the method explained with reference to FIG. 3.

Test patterns are explained below which can be used to determine imaging parameters of a multi-beam particle optical unit such as was explained with reference to FIG. 1. Such test patterns can be produced with high precision by being written on silicon wafers via lithography methods, for example.

Background information concerning test patterns for multi-beam particle systems can be gathered from WO 2013/032949 A1, which in the entire scope thereof is incorporated by reference in the present patent application.

These test patterns are preferably mounted on a movement table that also carries the object 7, such that during the operation of the multi-beam particle system the test pattern can be moved into the beam path 9 as necessary in order to implement a measurement, calibration and adjustment of the multi-beam particle system. After the conclusion of the measurement, calibration and adjustment, the object 7 can then be introduced again and the examination of the object can be continued.

Figure 4:
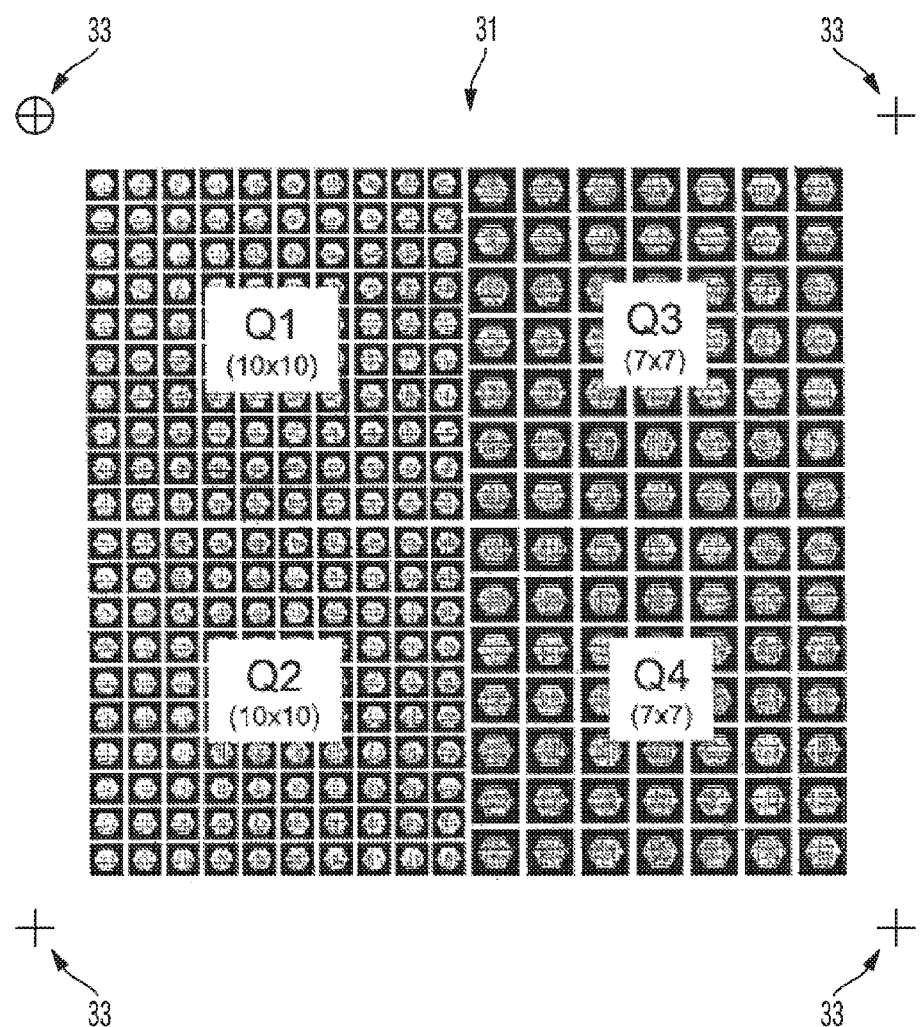
FIGS. 4, 5 and 6 show one embodiment of a test pattern in increasingly enlarged illustration.

FIG. 4 shows one example of a test pattern 31. The test pattern 31 comprises for example four squares Q1, Q2, Q3 and Q4 and for example four adjustment markings 33. The squares Q1 and Q2 each contain for example 10×10=100 small fields, while the squares Q3 and Q4 each contain for example 7×7=49 larger fields. The fields in all of the squares are identical test patterns in terms of their structure, which are described in greater detail below, but differ with regard to their size. The smaller fields of the squares Q1 and Q2 are provided for being measured with a field of particle beams having a distance of 12 micrometers, for example, while the larger fields of the squares Q3 and Q4 are provided for being measured with a field of particle beams having a distance of 18 micrometers, for example. The test patterns illustrated in black and white here in the figures correspond to patterns on the test wafer which, on account of their topography, that is to say for example on account of the orientation of their surfaces, or/and on account of their structure, that is to say for example on account of their chemical composition, lead to an intensity contrast in the recorded secondary electron images.

Figure 5:
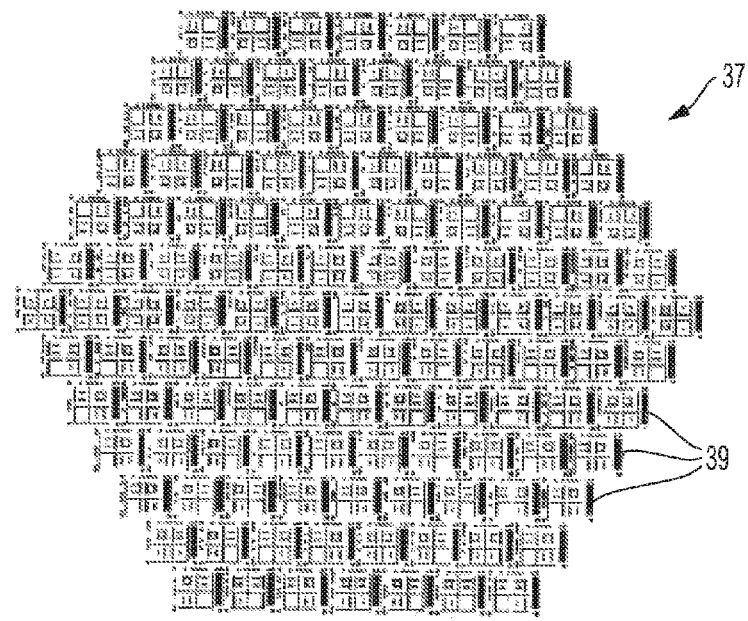

FIG. 5 shows one such field 37 in detail. It has a roughly hexagonal contour and is composed of 127 partial fields 39 arranged in rows, wherein the topmost row in FIG. 5 comprises seven partial fields 39. From top to bottom, the number of partial fields 39 increases in each case by one from row to row until the middle row contains 13 partial fields. Afterwards, the number of partial fields 39 per row decreases in each case by one from row to row until the bottommost row in FIG. 5 again contains seven partial fields. Each of the partial fields is provided for being scanned by a particle beam of the field of particle beams. The arrangement of the partial fields 39 in the field 37 therefore corresponds to the arrangement of the particle beams in the field of particle beams. That is to say that the field of particle beams is not arranged in a rectangular pattern as shown in FIG. 1, but rather in a hexagonal pattern.

Figure 6:
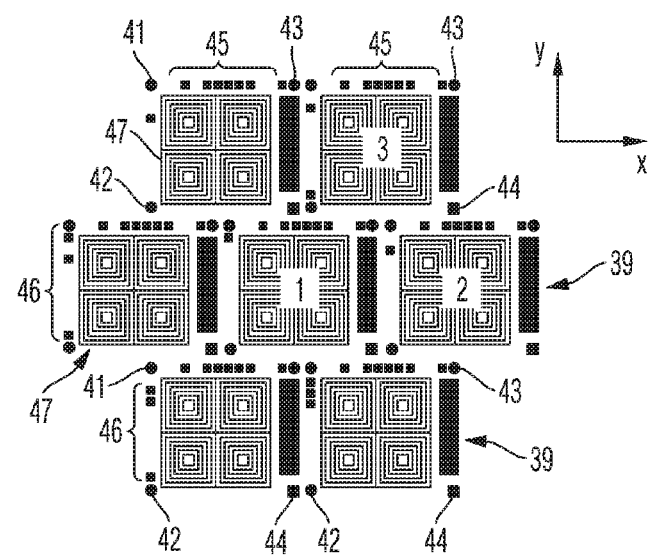

FIG. 6 shows an enlarged excerpt with seven partial fields 39 from FIG. 5. Each partial field 39 comprises reference markings 41, 42, 43 and 44, horizontal coding regions 45, vertical coding regions 46 and a test pattern 47. In the example illustrated in FIG. 6, the test patterns 47 are in each case four groups of nested squares. The coding regions 45 are subdivided in a number of 12 places, for example, each of which may or may not contain a coding element, such as a square, for example, such that each coding region can code a number. In this case, the vertical regions 46 code the number held by a specific partial field 39 in the field 37, and the horizontal regions 45 code the number held by a specific field 37 in one of the squares Q1, Q2, Q3 and Q4.

Figure 7:
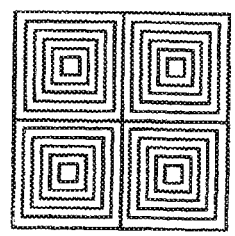
FIGS. 7 to 13 show variants of test patterns.
Figure 8:
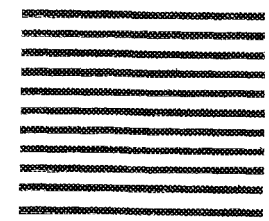
Figure 9:
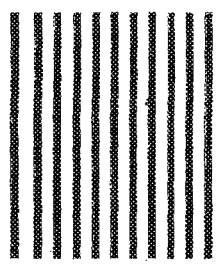
Figure 10:
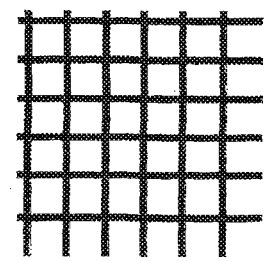
Figure 11:
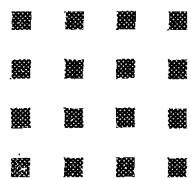
Figure 12:
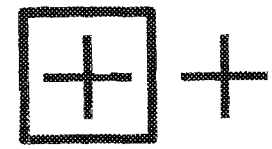

FIG. 7 shows the test pattern 47 in an enlarged illustration. The individual lines can have a line width of 60 nanometers, for example.

Figure 13:
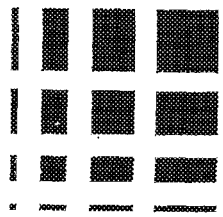

FIGS. 8 to 12 show variants of the test pattern from FIG. 7. The test pattern in FIG. 8 consists of horizontal lines, the test pattern in FIG. 9 consists of vertical lines, the test pattern in FIG. 10 consists of crossed lines, the test pattern in FIG. 11 consists of a grid arrangement of rectangles, the test pattern in FIG. 12 can consist of a cross in all test patterns apart from the central test pattern (right-hand partial illustration). The central test pattern can furthermore consist of a cross surrounded by a square (left-hand partial illustration). The test pattern in FIG. 13 is a non-periodic pattern of elements whose width varies non-linearly from left to right and from bottom to top. This test pattern is suitable in particular for tests that use a Fourier transformation as a step of the image processing.

The test patterns explained above are suitable for determining the imaging scale and the rotation which are obtained by the imaging provided by the particle optical unit. Test patterns designed as truncated pyramids, for example, are suitable for determining the convergence of the beam path, and so such a truncated pyramid has four oblique flanks of identical size. With a particle beam impinging on such a test structure perpendicularly, the oblique flanks appear to be of identical size, while they appear to be of different sizes in the case of an obliquely impinging particle beam. From a measurement of the width of the oblique flanks, it is thus possible to deduce the impingement angle of the particle beam and thus the convergence thereof.

The structures of the test wafer can be used in diverse ways for adjusting the multi-beam apparatus. These are in particular: the determination of the positions of the partial beams, the setting of the distance between the partial beams and the relative orientation of the multi-beams relative to the object stage, the telecentricity, in order to ensure that all object points are illuminated with an axially parallel beam, the calibration of the scan, in order to avoid distortions and non-linearities of the scanning field, and others.

In general, the test wafer is incorporated into the object stage such that the orientations of the test wafer structures correspond to the axes of movement of the stage.

Beam Position Measurement:

In order to determine the positions of the impingement locations of the beams in the sample plane, from which for example the magnification and the rotation are in turn determined, the following methods can be used:

a) Measuring Method with Calibrated Test Sample

A test sample with a calibrated structure is used, that is to say that the positions of the structures are known with respect to the test sample coordinate system. The test sample is scanned with all (or a selection from all) beams. The scan (specifically the pixel size and the orientation of the image coordinate system with respect to the test sample coordinate system) either is calibrated beforehand or can also be calibrated at the same time. The positions of the individual beams can be calculated from the images produced (or from the positions of the structures in the images). This can be carried out e.g. by unambiguously identifying the structures in the images and determining the positions in the images. Given a known position of the structures on the test sample and known transformation M between the test sample coordinate system and the image coordinate system, the position of the beams on the test wafer can be calculated from the positions of the structures in the scan images. Instead of explicitly identifying the structures in the individual images, it is also possible to use a periodically structured sample. It is then possible to determine the image displacement between two particle beams in each case: if one element of the periodic structure lies e.g. centrally in the image of a first particle beam, but in the image of a second particle beam one (different) element of the periodic structure lies in a manner displaced by (dx, dy) pixels from the image centre, the displacement vector (dx, dy) can be represented via a transformation matrix M in the test sample coordinate system. Given a known position of the elements of the periodic structure with respect to one another, it is then possible to calculate the positions of the second particle beam with respect to that of the first particle beam. This can take place in exactly the same way for the other particle beams, wherein it is advantageous in each case to determine the displacement relative to the same particle beam (e.g. the first particle beam) in order not to add up errors.

b) Overlap Measuring Method

Instead of a test sample with a calibrated structure, an arbitrarily structured sample can also be used. For this purpose, images are recorded, the image size of which is greater than the expected distance between the impingement locations of the particle beams on the sample, that is to say that the images of adjacent beams overlap. If images of two adjacent particle beams are compared and the displacement of the images with respect to one another is determined on the basis of the identical overlap regions, in the case of a calibrated scan (pixel size) it is possible to determine the position of the two particle beams with respect to one another in the image coordinate system. A relative position vector is thus obtained for each adjacent particle beam pair. The relative positions of all the particle beams with respect to one another can be calculated on the basis of these position vectors. The relative position between two particle beams can be determined either directly or via indirect paths (summation of the respective position vectors) via other beams.

Telecentricity Measurement:

As an alternative to the above-described measurement via a test sample with elevated structures, it is also possible to use an arbitrary flat, structured test sample which can be moved via a motorized sample stage in the z-direction (that is to say in height, parallel to the optical axis). Scan images (of all beams or of a selection from the beams) are then recorded in each case at at least two different z-positions. This is followed by determining (manually or automatically) how the sample structure in the image of an arbitrary particle beam at a first height z1 is displaced relative to the sample structure in the image of the same particle beam at a second height z2 changed relative to the first height z1. In the case of a calibrated scan, the displacement can be converted from pixels into e.g. nanometers. Together with the difference or distance between the two heights z1−z2 of the (calibrated)

sample stage, the impingement angle of the relevant particle beam can then be calculated from the determined displacement: t=a tan (displacement/(z1−z2)). If there are possibly more than two z-positions, the telecentricity can be calculated a number of times and averaged. In this case, the two heights z1 and z2 should be chosen such that the images lie within the depth of focus of the imaging, that is to say show sufficient contrast or sample details without readjustment (focus) of electron-optical elements, that is to say that the two heights z1, z2 should both be near the focal plane. The difference in the heights z1−z2 should moreover be chosen such that images of an arbitrary particle beam at all height positions show a common region of the sample structure, that is to say that the displacement must not be too large. Alternatively, the particle beam position measurement described elsewhere can also be carried out at each height position and the relative impingement angles of the particle beams with respect to one another can then be calculated from the differences between the particle beam positions and the difference z1−z2 between the height positions of the (calibrated) sample stage. For this method it is not necessary for images of a specific particle beam to show a common region of the sample structure in all height positions.

Scan Calibration:

The scan generator has to be calibrated for exact setting of the scanning field. This includes the deflection amplitude for the scan directions, the linearity of the scan, the orthogonality of the two deflection directions and the setting of the tilting point for obtaining the telecentricity in the case of relatively large scan fields. This can be carried out as follows: the scan calibration algorithm compares the real known positions of repeating structures on the test wafer with measured positions in the scan image. Magnification, rotation and distortions in the scan image can be determined and corrected on the basis of the differences.

Relative Resolution Measurement:

For routine operation of the multi-beam apparatus it is necessary that the resolution in each beam varies only within a specific tolerance range (e.g. ±5%, ±10% or ±20%). Furthermore, it is important to know the absolute resolution values for all of the beams. High-resolution measurements can be carried out with an (amorphous) sample with statistically distributed structures and distances. This sample advantageously has a very flat carrier, the flatness of which is smaller than the depth of focus of the multi-beam particle apparatus. In this case, the carrier has a relatively low secondary electron yield (e.g. silicon, carbon), while applied heavy metal islands (e.g. gold, platinum) have a high secondary electron yield.

The absolute resolution determination, for example by methods which use the edge steepness of the image information, is relatively computationally complex. Despite high accuracy, this measurement is not practical in the case of a large number of beams. Other resolution methods, based for example on 2D Fourier transformation, are less computationally complex. However, the absolute resolution value for example in the case of the Fourier transformation method is greatly dependent on the choice of the cut-off threshold which leads to the cut-off frequency in the reciprocal space, which yields a measure of the resolution. One advantageous implementation of a resolution determination for a multi-beam particle apparatus consists in implementing the absolute resolution measurement only on the basis of the image of an individual particle beam (reference beam) and determining the images of the remaining particle beams via a relative resolution criterion relative to the reference beam characterized in absolute terms. This can advantageously be carried out via the Fourier transformation method, wherein a constant cut-off frequency can be defined for all of the images. Therefore, the absolute choice of the cut-off threshold is not relevant to the relative resolution. The deviation of the corresponding spatial frequency thus forms a correction value for the isotropy of the resolution between the beams. The absolute resolution for each individual beam results from the resolution of the reference beam measured in absolute terms and the correction value.

Figure 14C:
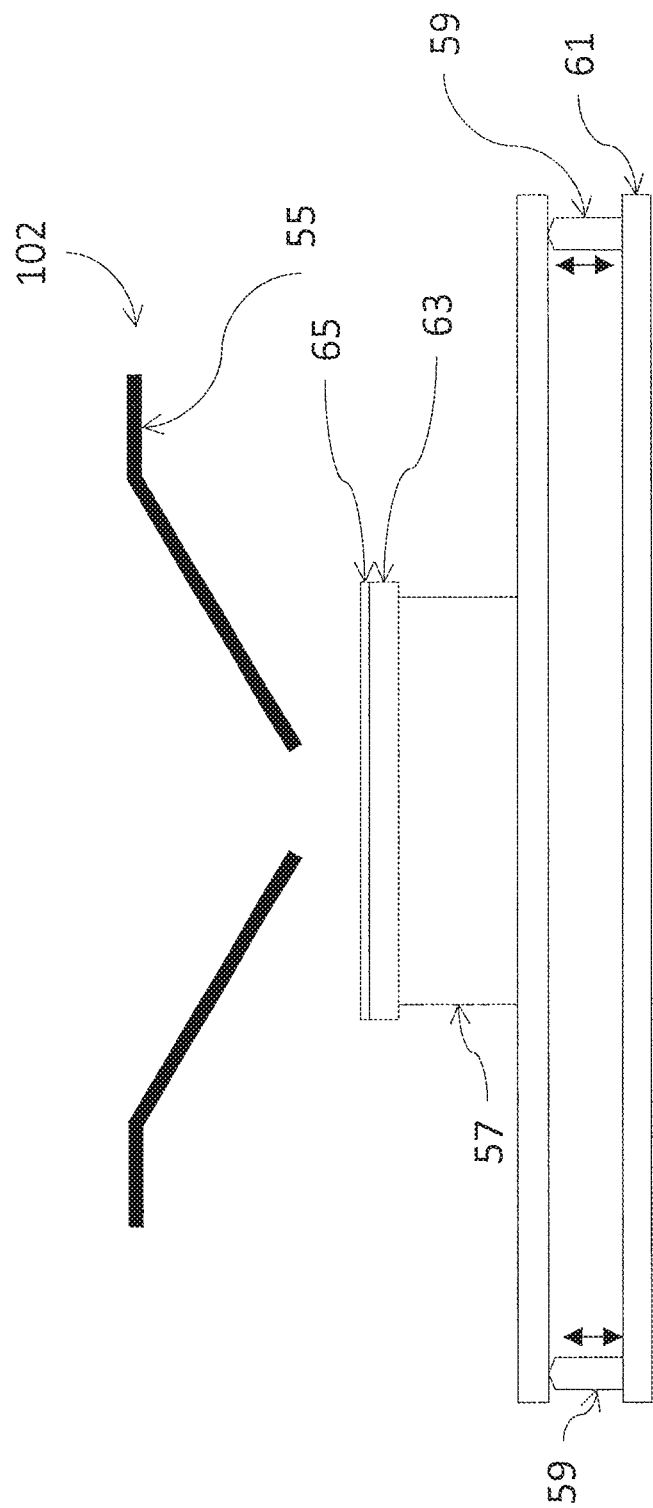

FIGS. 14a, 14b and 14c elucidate a technique for calibrating the position and tilting of a sample stage 63 relative to the objective lens 102 of the particle beam system. For this purpose, for example three measuring probes 53 are fitted to the sample stage 63 or to a reference stage 51 in order to measure a distance of the sample stage 63 or of the reference stage 51 at three positions, which are arranged in a manner distributed in the circumferential direction around a principal axis of the objective lens 102, with respect to a reference surface 55 of the objective lens 102. In this way, the sample stage 63 can be correctly aligned relative to the objective lens 102. The measuring probes can then be removed in order that the sample stage with a sample arranged thereon can be moved relative to the objective lens.

FIG. 14c shows the arrangement of a sample stage 63, with a sample 65 lying thereon, relative to the objective lens 102 of the particle beam system. Only the lower pole shoe of the objective lens 102 is shown. A movement table 57, which can move the sample parallel and perpendicular to the sample surface, is fixed to the sample chamber 61 via at least three actuators 59. These actuators can change the alignment of the sample stage with respect to the chamber and thus with respect to the objective lens 102, which is fixed to the chamber 61 via further mechanical components (not shown here). The actuators 59 can be for example manually adjustable set screws or piezo-actuators.

FIG. 14a shows in this respect a measuring system fitted to the movement table 57 in order to calibrate the position and the tilting of the sample stage 63 relative to the objective lens 102. The measuring system consists of a reference plate 51, to which for example three measuring probes 53 are fitted in order to measure a distance of the reference stage 51 at three positions, which are arranged in a manner distributed in the circumferential direction around a principal axis of the objective lens 102, with respect to a reference surface 55 of the objective lens 102. The reference surface 55 can be produced very precisely orthogonally to the axis of the objective lens 102. Instead of being mounted on a reference plate 51, the measuring probes can also be mounted on the sample stage 63.

For correctly determining the reference positions of the measuring probes, FIG. 14b shows a calibration object 104 which can be fixed on the reference plate 51. The reference surface 55' for the measuring probes can be produced very precisely parallel to the reference surface 55" with which the calibration object bears on the reference plate 51. In a first step, the calibration object 104 is mounted, and the positions of the measuring probes 53 relative to the reference surface 55' are determined. In a second step, the calibration object 104 is removed and the measuring probes 53 are moved relative to the objective lens 102. By adjusting the set screws, it is possible to align the reference plate 51 correctly relative to the objective lens 102 by setting the difference in the position of each measuring probe between the measurement in the first step and the measurement in the second step to the same value in the case of all the measuring probes. Afterwards, the measuring probes 53 and the reference plate 51 can be removed and the sample stage 63 can be mounted.

The axes of the movement table 57 can be produced very precisely parallel and orthogonally with respect to the sample stage 63. After the adjustment of the set screws 59 in the method described above, the sample stage 63 with a sample 65 arranged thereon can thus be moved relative to the objective lens 102 and orthogonally with respect to the axis of the objective lens 102, such that the distance in the direction of the axis of the objective lens 102 with respect to the sample 65 changes only slightly.

The invention claimed is:

1. A particle beam system, comprising:
   a multi-beam source configured to generate a first array of a plurality of first particle beams;
   a first particle optical unit configured to direct the first particle beams onto an object; and
   a controller;
   wherein:
      the first particle optical unit comprises at least two particle-optical lenses arranged in a beam path of the first particle optical unit;
      the controller is configured to set an effect of each of the at least two particle-optical lenses on the first particle beams so that, during use of the particle beam system:
         particles of the first particle beams are used to image a first plane onto a second plane; and
         the second plane coincides with an object plane so that the first particle beams impinge on the object at impingement locations which form a second array;
      the multi-beam source is fixed relative to the particle-optical lenses of the first particle optical unit;
      during use of the particle beam system, the first particle beams are situated within the first array at positions with fixed distances between one another;
      the controller is configured to change distances between the impingement locations within the second array by changing the effects of the particle-optical lenses of the first particle optical unit;
      the controller is configured to change an orientation of the second array of impingement locations relative to the particle-optical lenses by changing the effects of the particle-optical lenses of the first particle optical unit; and
      the controller is configured to change the distance between the impingement locations within the second array of impingement locations without changing the orientation of the second array of impingement locations and without changing a convergence of a beam path of the first particle optical unit.

2. The particle beam system of claim 1, further comprising:
   a detector comprising a plurality of detection regions arranged in a third array; and
   a second particle optical unit configured to direct second particle beams emerging from the impingement locations in the second array of impingement locations at the object onto the third array of detection regions,
   wherein:
      the second particle optical unit comprises at least two particle-optical lenses arranged in a beam path of the second particle optical unit; and
      the controller is configured to set an effect of each of the particle-optical lenses of the second particle optical unit on the second particle beams so that, during use of the particle beam system:
         particles of the second particle beams are used to image a third plane onto a fourth plane;
         the third plane is situated at the object and the fourth plane is situated at the third array of detection regions so that each of the second particle beams impinges on at least one of the detection regions arranged in the third array and mutually different second particle beams impinge on mutually different detection regions.

3. The particle beam system of claim 2, wherein:
   the detection regions are fixed relative to the particle-optical lenses of the second particle optical unit;
   the detection regions are within the third array at fixed distances from one another; and
   the controller is configured to compensate for changes in the distances between the impingement locations within the second array by changing the effects of the particle-optical lenses of the second particle optical unit so that, during use of the particle beam system, when there are changes in the distances between the impingement locations within the second array, each of the second particle beams impinges on the at least one of the detection regions arranged in the third array and mutually different second particle beams impinge on mutually different detection regions.

4. The particle beam system of claim 2, wherein the controller is configured to compensate for changes in the orientation of the second array of impingement locations relative to the particle-optical lenses of the second particle optical unit by changing the effects of the particle-optical lenses of the second particle optical unit so that, during use of the particle beam system, when there are changes in the orientation of the second array of impingement locations, each of the second particle beams impinges on the at least one of the detection regions arranged in the third array and mutually different second particle beams impinge on mutually different detection regions.

5. The particle beam system of claim 2, wherein one of the at least two particle-optical lenses of the first particle optical unit is one of the at least two particle-optical lenses of the second particle optical unit.

6. The particle beam system of claim 2, further comprising a particle-optical switch in the beam path of the first particle optical unit and in the beam path of the second particle optical unit.

7. A particle beam system, comprising:
   a multi-beam source configured to generate a first array of a plurality of first particle beams;
   a first particle optical unit configured to direct the first particle beams onto an object; and
   a controller;
   wherein:
      the first particle optical unit comprises at least two particle-optical lenses arranged in a beam path of the first particle optical unit;
      the controller is configured to set an effect of each of the at least two particle-optical lenses on the first particle beams so that, during use of the particle beam system:
         particles of the first particle beams are used to image a first plane onto a second plane; and
         the second plane coincides with an object plane so that the first particle beams impinge on the object at impingement locations which form a second array;
      the multi-beam source is fixed relative to the particle-optical lenses of the first particle optical unit;

during use of the particle beam system, the first particle beams are situated within the first array at positions with fixed distances between one another;

the controller is configured to change distances between the impingement locations within the second array by changing the effects of the particle-optical lenses of the first particle optical unit;

the controller is configured to change an orientation of the second array of impingement locations relative to the particle-optical lenses by changing the effects of the particle-optical lenses of the first particle optical unit; and the controller is configured to change the orientation of the second array of impingement locations without changing the distances between the impingement locations within the second array of impingement locations and without changing a convergence of a beam path of the first particle optical unit.

8. The particle beam system of claim 7, further comprising:

a detector comprising a plurality of detection regions arranged in a third array; and a second particle optical unit configured to direct second particle beams emerging from the impingement locations in the second array of impingement locations at the object onto the third array of detection regions, wherein:

the second particle optical unit comprises at least two particle-optical lenses arranged in a beam path of the second particle optical unit; and the controller is configured to set an effect of each of the particle-optical lenses of the second particle optical unit on the second particle beams so that, during use of the particle beam system:

particles of the second particle beams are used to image a third plane onto a fourth plane;

the third plane is situated at the object and the fourth plane is situated at the third array of detection regions so that each of the second particle beams impinges on at least one of the detection regions arranged in the third array and mutually different second particle beams impinge on mutually different detection regions.

9. The particle beam system of claim 8, wherein:

the detection regions are fixed relative to the particle-optical lenses of the second particle optical unit;

the detection regions are within the third array at fixed distances from one another; and the controller is configured to compensate for changes in the distances between the impingement locations within the second array by changing the effects of the particle-optical lenses of the second particle optical unit so that, during use of the particle beam system, when there are changes in the distances between the impingement locations within the second array, each of the second particle beams impinges on the at least one of the detection regions arranged in the third array and mutually different second particle beams impinge on mutually different detection regions.

10. The particle beam system of claim 8, wherein the controller is configured to compensate for changes in the orientation of the second array of impingement locations relative to the particle-optical lenses of the second particle optical unit by changing the effects of the particle-optical lenses of the second particle optical unit so that, during use of the particle beam system, when there are changes in the orientation of the second array of impingement locations, each of the second particle beams impinges on the at least one of the detection regions arranged in the third array and mutually different second particle beams impinge on mutually different detection regions.

11. The particle beam system of claim 8, wherein one of the at least two particle-optical lenses of the first particle optical unit is one of the at least two particle-optical lenses of the second particle optical unit.

12. The particle beam system of claim 8, further comprising a particle-optical switch in the beam path of the first particle optical unit and in the beam path of the second particle optical unit.

13. A particle beam system, comprising:

a multi-beam source configured to generate a first array of a plurality of first particle beams;

a first particle optical unit configured to direct the first particle beams onto an object; and a controller;

wherein:

the first particle optical unit comprises at least two particle-optical lenses arranged in a beam path of the first particle optical unit;

the controller is configured to set an effect of each of the at least two particle-optical lenses on the first particle beams so that, during use of the particle beam system:

particles of the first particle beams are used to image a first plane onto a second plane; and the second plane coincides with an object plane so that the first particle beams impinge on the object at impingement locations which form a second array;

the multi-beam source is fixed relative to the particle-optical lenses of the first particle optical unit;

during use of the particle beam system, the first particle beams are situated within the first array at positions with fixed distances between one another;

the controller is configured to change a distance between the first plane and the second plane;

the controller is configured to change distances between the impingement locations within the second array by changing the effects of the particle-optical lenses of the first particle optical unit; and the controller is configured to change the distance between the first plane and the second plane without changing the distances between the impingement locations within the second array and without changing a convergence of a beam path of the first particle optical unit.

14. The particle beam system of claim 13, further comprising:

a detector comprising a plurality of detection regions arranged in a third array; and a second particle optical unit configured to direct second particle beams emerging from the impingement locations in the second array of impingement locations at the object onto the third array of detection regions, wherein:

the second particle optical unit comprises at least two particle-optical lenses arranged in a beam path of the second particle optical unit; and the controller is configured to set an effect of each of the particle-optical lenses of the second particle optical unit on the second particle beams so that, during use of the particle beam system:

particles of the second particle beams are used to image a third plane onto a fourth plane;

the third plane is situated at the object and the fourth plane is situated at the third array of detection regions so that each of the second particle beams impinges on at least one of the detection regions arranged in the third array and mutually different second particle beams impinge on mutually different detection regions.

15. The particle beam system of claim 14, wherein:
the detection regions are fixed relative to the particle-optical lenses of the second particle optical unit;
the detection regions are within the third array at fixed distances from one another; and
the controller is configured to compensate for changes in the distances between the impingement locations within the second array by changing the effects of the particle-optical lenses of the second particle optical unit so that, during use of the particle beam system, when there are changes in the distances between the impingement locations within the second array, each of the second particle beams impinges on the at least one of the detection regions arranged in the third array and mutually different second particle beams impinge on mutually different detection regions.

16. The particle beam system of claim 14, wherein the controller is configured to compensate for changes in the orientation of the second array of impingement locations relative to the particle-optical lenses of the second particle optical unit by changing the effects of the particle-optical lenses of the second particle optical unit so that, during use of the particle beam system, when there are changes in the orientation of the second array of impingement locations, each of the second particle beams impinges on the at least one of the detection regions arranged in the third array and mutually different second particle beams impinge on mutually different detection regions.

17. The particle beam system of claim 14, wherein one of the at least two particle-optical lenses of the first particle optical unit is one of the at least two particle-optical lenses of the second particle optical unit.

18. The particle beam system of claim 14, further comprising a particle-optical switch in the beam path of the first particle optical unit and in the beam path of the second particle optical unit.

19. A particle beam system, comprising:
a multi-beam source configured to generate a first array of a plurality of first particle beams;
a first particle optical unit configured to direct the first particle beams onto an object; and
a controller;
wherein:
the first particle optical unit comprises at least two particle-optical lenses arranged in a beam path of the first particle optical unit;
the controller is configured to set an effect of each of the at least two particle-optical lenses on the first particle beams so that, during use of the particle beam system:
particles of the first particle beams are used to image a first plane onto a second plane; and
the second plane coincides with an object plane so that the first particle beams impinge on the object at impingement locations which form a second array;
the multi-beam source is fixed relative to the particle-optical lenses of the first particle optical unit;

during use of the particle beam system, the first particle beams are situated within the first array at positions with fixed distances between one another;
the controller is configured to change a distance between the first plane and the second plane;
the controller is configured to change an orientation of the second array of impingement locations relative to the particle-optical lenses by changing the effects of the particle-optical lenses of the first particle optical unit; and
the controller is configured to change the distance between the first plane and the second plane without changing the orientation of the second array of impingement locations and without changing a convergence of a beam path of the first particle optical unit.

20. The particle beam system of claim 19, further comprising:
a detector comprising a plurality of detection regions arranged in a third array; and
a second particle optical unit configured to direct second particle beams emerging from the impingement locations in the second array of impingement locations at the object onto the third array of detection regions, wherein:
the second particle optical unit comprises at least two particle-optical lenses arranged in a beam path of the second particle optical unit; and
the controller is configured to set an effect of each of the particle-optical lenses of the second particle optical unit on the second particle beams so that, during use of the particle beam system:
particles of the second particle beams are used to image a third plane onto a fourth plane;
the third plane is situated at the object and the fourth plane is situated at the third array of detection regions so that each of the second particle beams impinges on at least one of the detection regions arranged in the third array and mutually different second particle beams impinge on mutually different detection regions.

21. The particle beam system of claim 20, wherein:
the detection regions are fixed relative to the particle-optical lenses of the second particle optical unit;
the detection regions are within the third array at fixed distances from one another; and
the controller is configured to compensate for changes in the distances between the impingement locations within the second array by changing the effects of the particle-optical lenses of the second particle optical unit so that, during use of the particle beam system, when there are changes in the distances between the impingement locations within the second array, each of the second particle beams impinges on the at least one of the detection regions arranged in the third array and mutually different second particle beams impinge on mutually different detection regions.

22. The particle beam system of claim 20, wherein the controller is configured to compensate for changes in the orientation of the second array of impingement locations relative to the particle-optical lenses of the second particle optical unit by changing the effects of the particle-optical lenses of the second particle optical unit so that, during use of the particle beam system, when there are changes in the orientation of the second array of impingement locations, each of the second particle beams impinges on the at least one of the detection regions arranged in the third array and mutually different second particle beams impinge on mutually different detection regions.

23. The particle beam system of claim 20, wherein one of the at least two particle-optical lenses of the first particle optical unit is one of the at least two particle-optical lenses of the second particle optical unit.

24. The particle beam system of claim 20, further comprising a particle-optical switch in the beam path of the first particle optical unit and in the beam path of the second particle optical unit.

* * * * *